United States Patent [19]
Kitamura et al.

[11] 3,890,592
[45] June 17, 1975

[54] CONTACTLESS CONTROL SYSTEM FOR VOLUME CONTROL AND POWER ON-OFF CONTROL

[75] Inventors: Sadafumi Kitamura, Neyagawa; Toshiji Kanamaru, Katano, both of Japan

[73] Assignee: Matsushita Electric Industrial Co., Ltd., Osaka, Japan

[22] Filed: July 31, 1972

[21] Appl. No.: 276,737

[30] Foreign Application Priority Data

Aug. 10, 1971 Japan ................................ 46-60721
Nov. 12, 1971 Japan .............................. 46-106218

[52] U.S. Cl. ............ 340/15; 178/DIG. 15; 325/392
[51] Int. Cl. ......................... H04b 11/00; H04n 5/44
[58] Field of Search ................ 178/DIG. 15; 340/15; 325/392

[56] References Cited

UNITED STATES PATENTS

| | | | |
|---|---|---|---|
| 2,923,918 | 2/1960 | Adler | 178/DIG. 15 |
| 3,537,012 | 10/1970 | Reichard et al. | 325/392 |
| 3,678,392 | 7/1972 | Houghton | 325/392 |
| 3,713,028 | 1/1973 | Boyd et al. | 178/DIG. 15 |

*Primary Examiner*—Maynard R. Wilbur
*Assistant Examiner*—G. E. Montone
*Attorney, Agent, or Firm*—Stevens, Davis, Miller & Mosher

[57] ABSTRACT

A contactless control system for volume control and power on-off control comprising a sound circuit for volume control according to an input d-c control signal and a circuit to on-off control the connection of a power source to a load by the switching action of a semiconductor switching element on-off controlled by the afore-said d-c control signal. The d-c control signal may be produced from a signal generated by a remote control transmitter and so forth, and it is used both for the power on-off control by the switching action of the switching element and for the volume control.

4 Claims, 5 Drawing Figures

CONTACTLESS CONTROL SYSTEM FOR VOLUME CONTROL AND POWER ON-OFF CONTROL

This invention relates to control systems for volume control and power on-off control in television receivers and radio receivers.

An object of the invention is to make it possible to effect continuous volume control and power on-off control by the same signal, to thereby simplify the operation of the operator.

Another object of the invention is to obtain the above action through remote control.

A further object of the invention is to make the volume control and power on-off control by means of touch switches.

The above and other objects and also features and advantages of the invention will become more apparent from the following description when read with reference to the accompanying drawing, in which.

Figure 1:
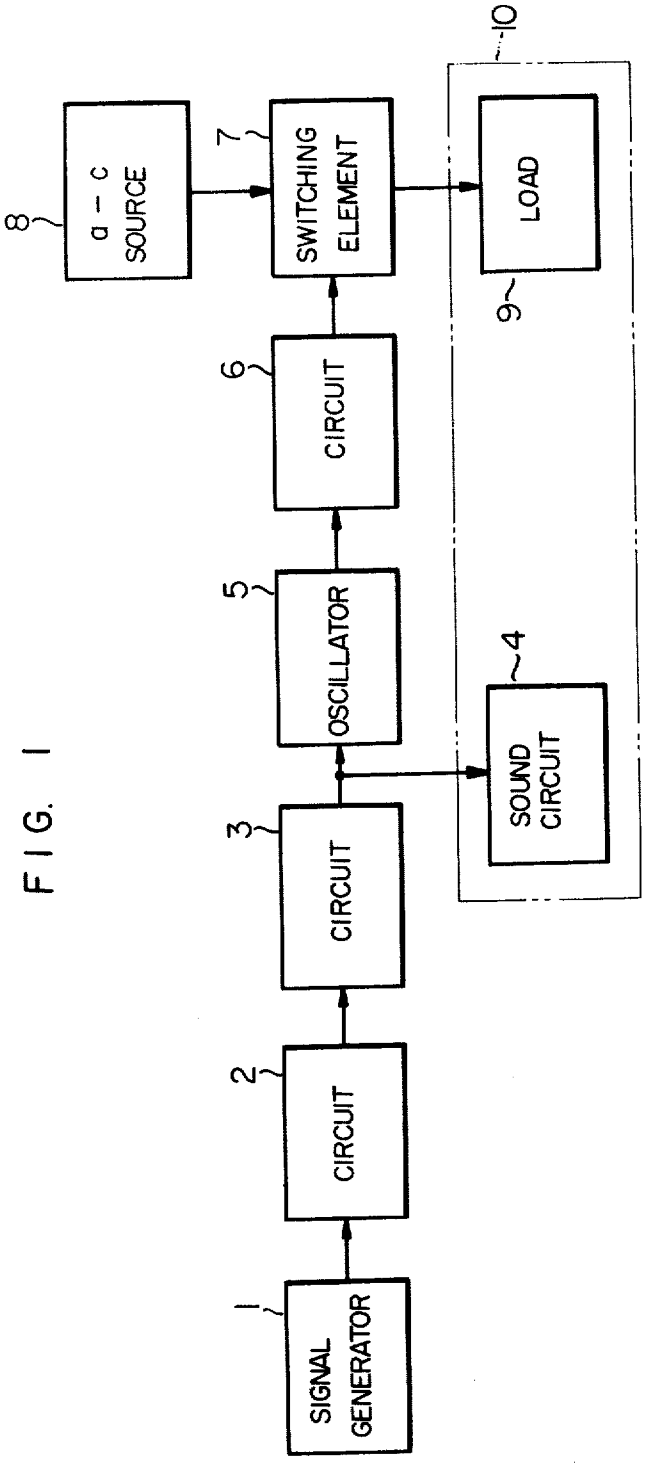
FIG. 1 is a block diagram of a contactless control system for volume control and power on-off control embodying the invention.

Referring now to FIG. 1, which is a block form representation of the control system according to the invention, numeral 1 designates a signal generator to produce a signal including information for volume control and source on-off control without any mechanical switch, numeral 2 a circuit to obtain a d-c voltage from the output of the signal generator 1 and memorize the d-c voltage thus obtained, numeral 3 a circuit to read out the memorized d-c voltage to obtain a d-c control signal therefrom for impression on a load, numeral 4 a sound circuit whose amplification degree is controlled by the control signal from the circuit 3 for volume control, numeral 5 an oscillator, numeral 6 a circuit to amplify and rectify the output of the oscillator 5, and numeral 7 a switching element to on-off control supply of power from an a-c source 8 to a load 9. The sound circuit 4 and load 9 may constitute a radio circuit 10 in a television receiver or radio receiver.

This system enables volume control within the sound circuit 4 and on-off control of the supply of power to the load 9 with the signal produced by the signal generator 1. Also, it is possible to effect continuous volume control from low volume to high volume by a d-c voltage corresponding to the duration of the signal of the signal generator.

Figure 2:
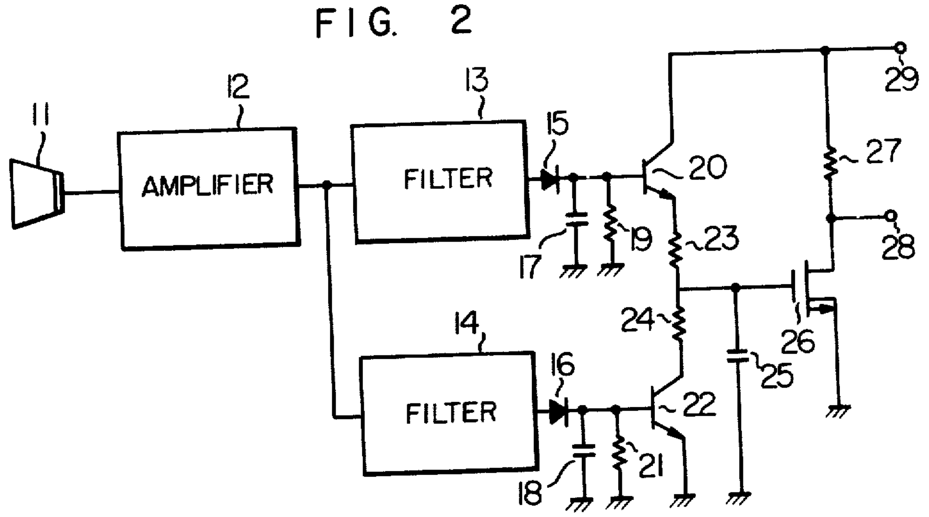
FIG. 2 is a circuit diagram showing part of the FIG. 1 embodiment of the invention applied to a remote control system utilizing ultrasonic waves.

FIG. 2 shows an example of the circuit construction of the blocks 1 to 3 in the system of FIG. 1. This example is intended for the remote control of volume and supply of power to the load. In the Figure, numeral 11 designates a microphone provided on the side of the body of a television receiver, numeral 12 an amplifier, numerals 13 and 14 filters having different pass bands, numerals 15 and 16 diodes for rectifying the respective outputs of the filters 13 and 14, numerals 17 and 18 smoothing capacitors, numeral 19 a resistor determining the base bias on a transistor 20, numeral 21 a resistor determining the base bias on a transistor 22, numerals 23 and 24 resistors determining the time constant of charging or discharging of a capacitor 25, numeral 26 a field-effect transistor of high input impedance, numeral 27 a drain load resistor, numeral 28 an output terminal, and numeral 29 a source terminal at which a d-c voltage normally prevails.

In operation, an ultrasonic wave transmitted from a remote control transmitter is detected by the microphone 11, and the detection signal output of the microphone is amplified by the amplifier 12. If this signal contains a signal admitted through the filter 13, the transistor 20 is triggered to cause gradual charging of the capacitor 25 by the source voltage at the terminal 29 through the on-state transistor 20 and resistor 23. Upon the subsequent disappearance of the signal from the remote control transmitter, that is, the signal admitted through the filter 13, the transistor 20 is cut off to open the charging loop for charging the capacitor 25. The cut-off impedances of the transistors 20 and 22 and the input impedance of the field-effect transistor 26 are selected to be sufficiently high to hold the terminal voltage previously developed across the capacitor 25 for a long time.

If the signal received by the microphone 11 contains a component admitted through the filter 14, this time the transistor 22 is triggered, so that the capacitor 25 is discharged through the resistor 24 and transistor 22.

In the above manner, the capacitor 25 may be gradually charged or discharged in response to the signal generated by a remote control transmitter. With the charging or discharging of the capacitor 25 the drain-source impedance of the field-effect transistor 26, and hence the drain voltage thereon, is changed to change the amplification degree of a sound amplifier which may be connected to the terminal 28. Thus, it is possible to gradually change the volume.

Further, it is possible to achieve on-off control of power source by rendering an oscillator connected to the terminal 28 operative or inoperative in response to the signal received by the microphone.

Figure 3:
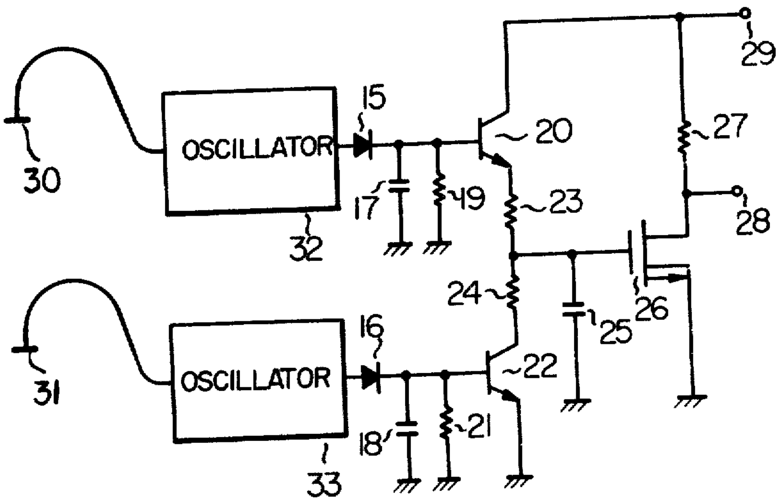
FIG. 3 is a circuit diagram showing another example of part of the FIG. 1 embodiment of the invention applied to a touch switch control system.

FIG. 3 shows another embodiment. This embodiment, unlike the FIG. 2 embodiment for the remote control utilizing an ultrasonic wave, uses touch switches. In FIG. 3, numerals 30 and 31 designate touch pieces made of metal, and numerals 32 and 33 oscillators which oscillate when the associated touch piece 30 or 31 is touched with a finger. This type of circuit is well known in the art as a touch switch. Parts 15 to 29 are the same as and serve the same end as the corresponding parts in the embodiment of FIG. 2.

In operation, if the touch piece 30 is touched with a finger, the oscillator 32 starts oscillation to trigger the transistor 20 so as to cause charging of the capacitor 25. On the other hand, if the touch piece 31 is touched with a finger, the transistor 22 is similarly triggered to cause discharging of the capacitor 25. Thus, the gate potential on the field-effect transistor 26 is changed by touching the touch piece 30 or 31 with a finger. In this way, the output at the output terminal 28 may be gradually changed.

Figure 4:
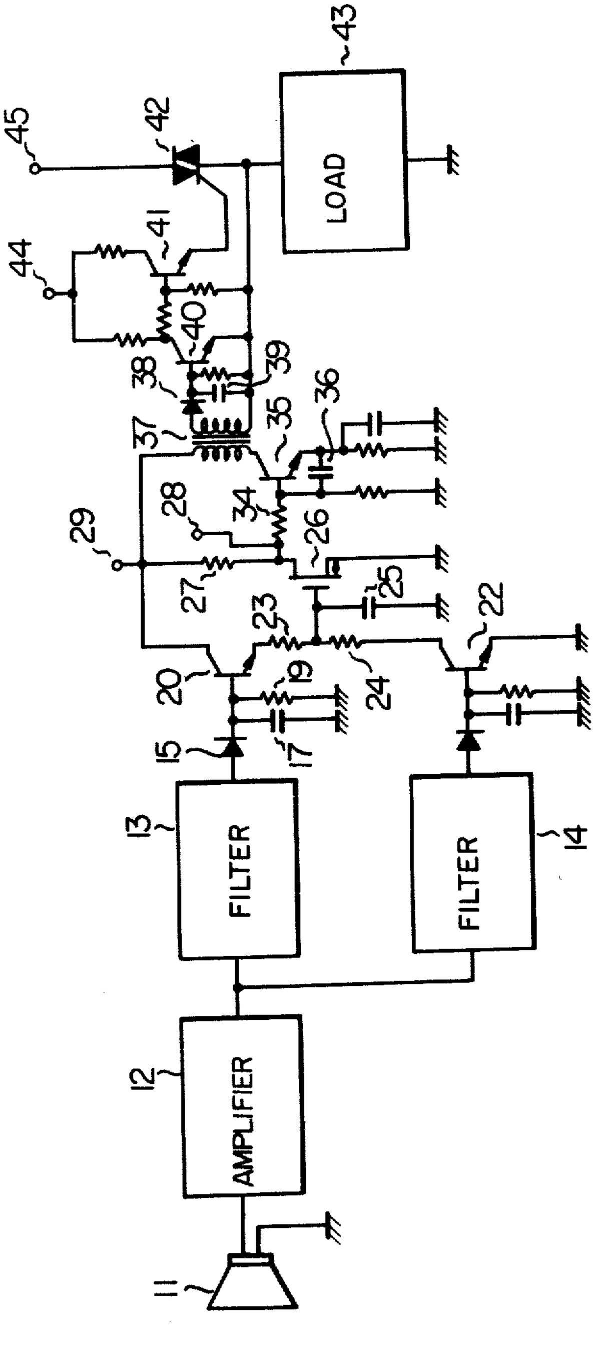
FIG. 4 is a circuit diagram showing a contactless control system for volume control and power on-off control embodying the invention applied to the remote control system.

FIG. 4 shows a circuit in a television receiver or radio receiver. It is intended for the remote control of volume and supply of power. In this circuit, parts 11 to 27 and 29 are same as corresponding parts of like reference numerals shown in FIG. 2. Numeral 34 designates a base resistor connected to a transistor 35, which constitutes an oscillator together with a feed-back capacitor 36. Numeral 37 designates a coupling transformer, numeral 38 a rectifying diode, numeral 39 a smoothing capacitor, numerals 40 and 41 switching transistors, numeral 42 a triac, and numeral 43 a load including rectifying and smoothing circuits. A d-c voltage normally prevails at a terminal 44, and a commercial a-c voltage is added to a terminal 45.

In this embodiment, the gate signal for the triac 42 should be impressed between the gate and cathode thereof, so that the gate signal circuit for the triac 42 should be separately grounded with respect to the oscillator. To this end, use is made of the insulating transformer 37, and the power supply to and grounding of the circuit on the side of the transformer 37 toward the triac 42 should be separate from the power supply to and grounding of the opposite side circuit.

The sound amplifier connected to the terminal is now assumed to be of such character that the volume is increased with reduction in the voltage appearing at the terminal 28 and is reduced with increasing voltage. The transistor 35 is biased such that it is triggered when the amplification degree of the sound amplifier is reduced to a minimum with increase of the drain voltage on the transistor 26. Upon triggering of the transistor 35, oscillation of the oscillator is started due to the feed-back action of the capacitor 36, thus causing an output to appear on the secondary side of the transformer 37. This output is rectified through the diode 38 and smoothed through the capacitor 39 to impress the resultant signal on the base of the transistor 40. Thus, the transistor 40 is triggered to cut off the transistor 41. As a result, the gate signal of the gate of the triac 42 vanishes, so that the triac is turned non-conductive.

Conversely, with reduction in the drain voltage on the field-effect transistor 26 the amplification degree of the sound amplifier is increased to eventually cut off the transistor 35, whereupon the output across the secondary of the transformer 37 vanishes to cut off the transistor 40 and trigger the transistor 41, so that the triac 42 is turned conductive.

While in the preceding embodiment the volume control and power on-off control are effected by the signal received by the microphone 11, similar effects may also be obtained where the touch switch as shown in FIG. 3 is used.

In the embodiment of FIG. 4, the power on-off control can be done by utilizing the control signal for the volume control in the contact-free operation. Also, the fact that the volume is always reduced to minimum at the time of turning off the power source and always rises from the minimum when turning on the power source is very favorable from the standpoint of auditory sensitivity.

In the above embodiment, if the "power off" signal continues to be sent forth from the remote control transmitter after the power source is turned off, that is, after the triac 42 is turned non-conductive, the transistor 22 continues to carry current through the filter 14, so that the capacitor 25 continues to be discharged through the transistor 22 and resistor 24. Thus, the terminal voltage across the capacitor 25 is excessively reduced, and in such case even if the "power on" signal is subsequently transmitted for triggering the transistor 20 and causing the charging of the capacitor 25, the triac 42 will not be turned conductive until extra charging of the capacitor to make up for the excessive reduction of its terminal voltage is effected. In such case, therefore, a long time is required until the power source is turned on.

Figure 5:
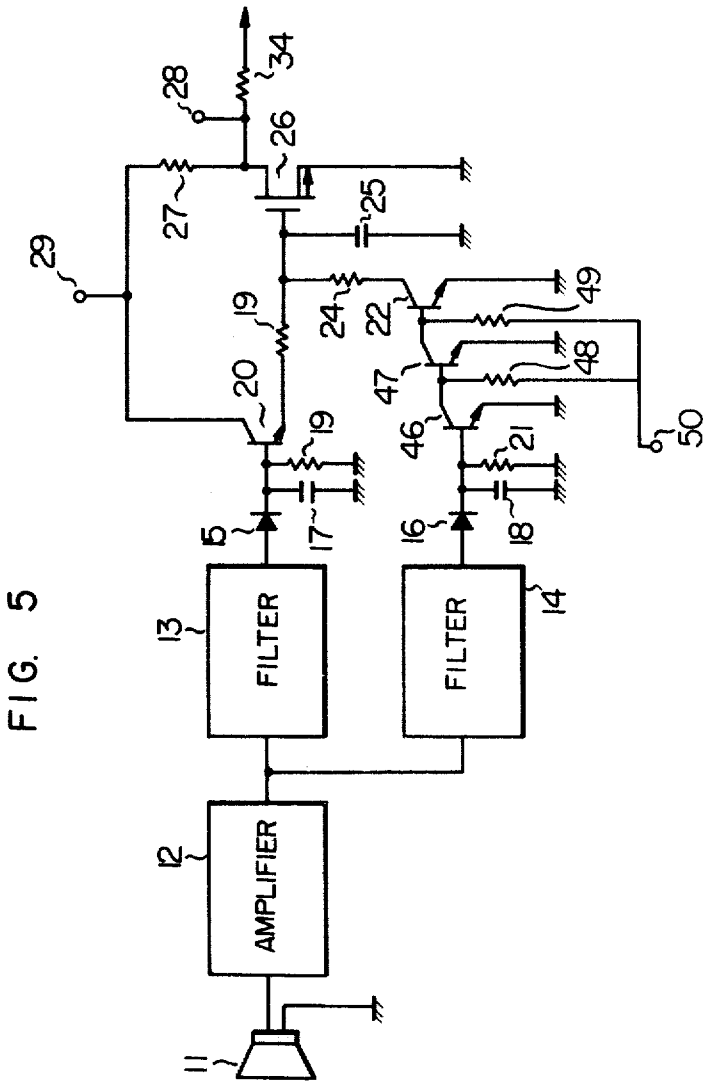
FIG. 5 is a circuit diagram showing part of a modification of the contactless control system of FIG. 4.

This drawback can be overcome by the circuit shown in FIG. 5. In this circuit, transistors 46 and 47 are provided between diode 16 and base of the transistor 22, with their emitters connected to ground and their collectors connected through respective resistors 48 and 49 to a terminal 50, to which a d-c voltage is applied. For the circuit after the resistor 34, the corresponding part of the circuit of FIG. 4 may be directly used, so it will not be described any further.

The terminals 29 and 50 in this circuit are respectively connected to different bias sources, and applied to the terminal 50 is a d-c voltage obtained from the system on-off controlled by the triac 42.

Upon arrival of the "power on" signal, the charging of the capacitor 25 is caused to turn the triac 42 conductive, as mentioned earlier. Upon subsequent arrival of the "power off" signal, the transistor 46 is triggered to cut off the transistor 47 and trigger the transistor 22 so as to cause discharging of the capacitor 25 through the transistor 22 and resistor 24. When the terminal voltage across the capacitor 25 is reduced to a predetermined level, the triac 42 is turned non-conductive, and at the same time the power supply biasing the terminal 50 is turned off. As a result, the transistors 46, 47 and 22 are rendered inoperative. Thus, once the triac 42 is turned nonconductive, the terminal voltage across the capacitor 25 is held at the level that prevailed at the instant when power is cut off even if the "power off" signal is continued for some time thereafter.

Subsequently, by transmitting the "power-on" signal for triggering the transistor 20 to cause charging of the capacitor 25, the triac 42 can be turned conductive in an extremely short time.

As has been described in the foregoing, with the circuit of FIG. 5, in which the bias source for the discharging circuit for the discharging of the capacitor providing a voltage for the volume control is on-off controlled by the switching element on-off controlling the supply of power to the load, the possibility of excessively discharging the after-said capacitor at the time of turning off the power source can be eliminated. Thus, in addition to the possibility of volume control and power on-off control without involving any mechanical switch action, the time until the power source is turned on by sending the "power on" signal can be widely reduced independently of any operating condition.

What we claim is:

1. A contactless control system for volume control and for on-off controlling power source which comprises:

means for generating first and second signals containing information for volume control and power source on-off control;

means for receiving each signal to produce a D-C voltage corresponding to the duration of said signal and memorize the voltage thus produced, wherein said receiving and memorizing means comprises a capacitor;

means to charge said capacitor by one of said two signals;

means to discharge said capacitor by the other signal;

a sound amplifier coupled to said memorizing means for amplifying a sound input signal and whose amplification degree is controlled by said D-C control signal for volume control;

a semiconductor switching element connected between a power source and a load; and means to on-off control said switching element in response to said D-C control signal, including an oscillator rendered operative when the level of said D-C control signal is at a predetermined level and a rectifying and smoothing circuit for rectifying and smoothing the output of said oscillator, the output of said rectifying and smoothing circuit being impressed on the gate electrode of said semiconductor switching element, said predetermined level of said D-C control signal corresponding to the minimum amplification degree of said sound amplifier.

2. The contactless control system according to claim 1, wherein said signal generating means comprises a transmitting means capable of transmitting an ultrasonic wave remote control signal continuously for a desired interval of time and means to receive said ultrasonic wave and produce said signal containing information for volume control and power on-off control.

3. The contactless control system according to claim 1, wherein the terminal voltage across said capacitor is taken out as said D-C control signal; and said oscillator and rectifying and smoothing circuit in said switching element on-off control means are coupled by a transformer, said rectifying and smoothing circuit being grounded separately of said oscillator.

4. A contactless volume and power source control system for controlling the amplification factor of an amplifying circuit, comprising:

first means for generating a first signal for ordering an increase in said volume;

second means for generating a second signal for ordering a decrease in said volume;

first and second switching elements coupled to each other and to the outputs of said first and second generating means, respectively;

storage means coupled to the junction of said first and second switch elements for storing a voltage when said first switching element is made conductive by said first signal and for discharging the stored voltage when said second switching element is made conductive by said second signal;

third means coupled to said storage means for generating a DC voltage corresponding to the voltage stored in said storage means;

control means coupled between said third generating means and said amplifying circuit for controlling the amplification factor of said amplifying circuit by means of said DC voltage;

an oscillator circuit coupled to said DC voltage generating means for generating an AC output signal when said oscillator circuit is triggered into operation by a predetermined voltage level produced at the output of said DC voltage generating means;

a rectifying circuit coupled to the output of said oscillator circuit for rectifying an output signal generated by said oscillator circuit;

a further semiconductor switching element coupled in series between said amplifying circuit and a power source for supplying power to said amplifying circuit; and further switching means coupled between said rectifying circuit and said further semiconductor switching element to switch said further semiconductor switching element between conductive and non-conductive states as a function of the presence and absence, respectively, of a signal generated by said oscillator circuit.

* * * * *